(12) United States Patent
Yoshioka et al.

(10) Patent No.: US 9,608,657 B1
(45) Date of Patent: Mar. 28, 2017

(54) A/D CONVERTER CIRCUIT, PIPELINE A/D CONVERTER, AND WIRELESS COMMUNICATION DEVICE

(71) Applicant: KABUSHIKI KAISHA TOSHIBA, Minato-ku (JP)

(72) Inventors: Kentaro Yoshioka, Setagaya (JP); Tetsuro Itakura, Nerima (JP); Masanori Furuta, Odawara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/261,536

(22) Filed: Sep. 9, 2016

(30) Foreign Application Priority Data

Sep. 10, 2015 (JP) ................................. 2015-178185

(51) Int. Cl.
*H03M 1/00* (2006.01)
*H03M 1/12* (2006.01)
*H03M 1/46* (2006.01)

(52) U.S. Cl.
CPC ......... *H03M 1/1245* (2013.01); *H03M 1/466* (2013.01)

(58) Field of Classification Search
CPC ............ H03M 1/00; H03M 1/12; H03M 1/46; H03M 1/466; H03M 3/458; H03M 1/403; H03M 1/66; H03M 2201/13; H03M 2201/51; H03M 2201/11; H03M 2201/1136; H03M 1/682; H03M 2201/12; H03M 2201/20; H03M 2201/30; H03M 3/50
USPC ......................................... 341/155, 110, 122
See application file for complete search history.

(56) References Cited

U.S. PATENT DOCUMENTS

| | | | |
|---|---|---|---|
| 4,308,524 A * | 12/1981 | Harrison | H03M 1/40 341/118 |
| 6,828,927 B1 | 12/2004 | Hurrell et al. | |
| 7,030,804 B2 * | 4/2006 | Yoshioka | G11C 27/024 341/155 |

(Continued)

OTHER PUBLICATIONS

B. Robert Gregoire, et al., "An Over-60 dB True Rail-to-Rail Performance Using Correlated Level Shifting and an Opamp With Only 30 dB Loop Gain", IEEE Journal of Solid-State Circuits, vol. 43, No. 12, 2008, pp. 2620-2630.

(Continued)

*Primary Examiner* — Jean B Jeanglaude
(74) *Attorney, Agent, or Firm* — Oblon, McClelland, Maier & Neustadt, L.L.P.

(57) ABSTRACT

An A/D converter circuit has an amplifier circuit to amplify an input signal and output a first amplification signal and a second amplification signal, the second amplification signal having an amplification error smaller than that in the first amplification signal, a first sampling circuit to sample the first amplification signal, a first A/D converter to perform A/D conversion on the first amplification signal sampled by the first sampling circuit and output a first digital signal, a second sampling circuit to sample the second amplification signal, a D/A converter to perform D/A conversion on the first digital signal and output a first analog signal, a subtracter to subtract the first analog signal from the second amplification signal sampled by the second sampling circuit and output a second analog signal, and a second A/D converter to perform A/D conversion on the second analog signal and output a second digital signal.

20 Claims, 14 Drawing Sheets

(56) References Cited

U.S. PATENT DOCUMENTS

| | | | | |
|---|---|---|---|---|
| 7,439,889 B2* | 10/2008 | Fujimoto | ............ | H03M 1/0836 |
| | | | | 341/120 |
| 7,612,700 B2* | 11/2009 | Kawahito | ............. | H03M 1/002 |
| | | | | 341/161 |
| 7,924,203 B2 | 4/2011 | Hurrell | | |
| 8,253,622 B2* | 8/2012 | Hampel | ................ | G01S 13/781 |
| | | | | 342/147 |
| 8,564,469 B2* | 10/2013 | Nam | ..................... | H03M 1/069 |
| | | | | 341/155 |
| 8,825,440 B2* | 9/2014 | Yamada | ............... | G01D 5/2073 |
| | | | | 318/606 |
| 9,118,340 B2* | 8/2015 | Shiraishi | ............... | H03M 3/414 |
| 2007/0013571 A1* | 1/2007 | Fujimoto | ............ | H03M 1/0836 |
| | | | | 341/155 |
| 2010/0039306 A1* | 2/2010 | Simony | ................ | H03M 1/182 |
| | | | | 341/156 |
| 2010/0060494 A1* | 3/2010 | Pedersen | ............. | H03M 1/0695 |
| | | | | 341/110 |
| 2010/0073206 A1* | 3/2010 | Lee | ..................... | H03M 1/1033 |
| | | | | 341/118 |
| 2015/0138005 A1* | 5/2015 | Shiraishi | ............... | H03M 3/414 |
| | | | | 341/122 |

OTHER PUBLICATIONS

Pieter Harpe, et al., "A 7-to-10b 0-to-4MS/s Flexible SAR ADC with 6.5-to-16fJ/conversion-step", IEEE International Solid-State Circuits Conference, 2012, pp. 472-473 and Cover Page.

Soon-Kyun Shin, et al., "A 12 bit 200 MS/s Zero-Crossing-Based Pipelined ADC With Early Sub-ADC Decision and Output Residue Background Calibration", IEEE Journal of Solid-State Circuits, vol. 49, No. 6, 2014, pp. 1366-1382.

* cited by examiner

A/D CONVERTER CIRCUIT, PIPELINE A/D CONVERTER, AND WIRELESS COMMUNICATION DEVICE

CROSS REFERENCE TO RELATED APPLICATIONS

This application is based upon and claims the benefit of priority from the prior Japanese Patent Application No. 2015-178185, filed on Sep. 10, 2015, the entire contents of which are incorporated herein by reference.

FIELD

Embodiments of the present invention relate to an A/D converter circuit, a pipeline A/D converter, and a wireless communication device.

BACKGROUND

The speed of a general pipeline A/D converter is controlled by amplification time for an operational amplifier to amplify a residual signal and A/D conversion time for the post-stage to perform A/D conversion on the residual signal amplified by the operational amplifier. As a method to shorten the A/D conversion time, it is proposed to perform A/D conversion on upper bits of the residual signal by a first A/D converter before performing A/D conversion on lower bits of the residual signal by a second A/D converter (e.g. a successive approximation A/D converter) utilizing the result of A/D conversion performed by the first A/D converter. This method makes it possible to shorten the A/D conversion time for the successive approximation A/D converter, by which A/D conversion time as a whole can be consequently shortened.

However, in the above conventional method, the residual signal inputted into the first A/D converter and that inputted into the second A/D converter are sampled at the same timing, which causes overhead in the sampling period and imposing a limitation on the speed of A/D conversion.

DETAILED DESCRIPTION

Figure 1:
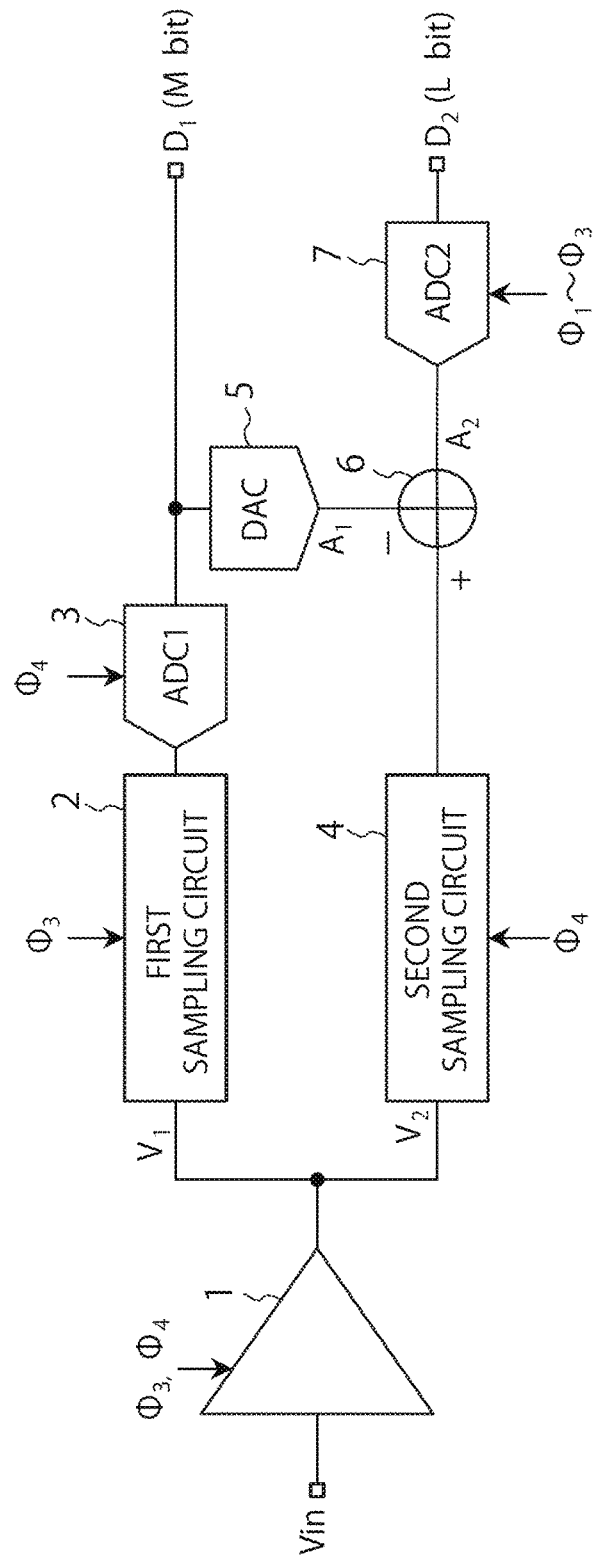
FIG. 1 is a diagram showing an example of an A/D converter circuit according to a first embodiment.

According to one embodiment, an A/D converter circuit has:

an amplifier circuit to amplify an input signal and output a first amplification signal and a second amplification signal, the second amplification signal having an amplification error smaller than that in the first amplification signal;

a first sampling circuit to sample the first amplification signal;

a first A/D converter to perform A/D conversion on the first amplification signal sampled by the first sampling circuit and output a first digital signal;

a second sampling circuit to sample the second amplification signal;

a D/A converter to perform D/A conversion on the first digital signal and output a first analog signal;

a subtracter to subtract the first analog signal from the second amplification signal sampled by the second sampling circuit and output a second analog signal; and a second A/D converter to perform A/D conversion on the second analog signal and output a second digital signal.

Hereinafter, embodiments of the present invention will be explained referring to the drawings.

First Embodiment

An A/D converter circuit according to a first embodiment will be explained referring to FIGS. 1 to 4. FIG. 1 is a diagram showing an example of an A/D converter circuit according to the present embodiment. As shown in FIG. 1, the A/D converter circuit according to the present embodiment has an amplifier circuit 1, a first sampling circuit 2, a first A/D converter 3, a second sampling circuit 4, a D/A converter 5, a subtracter 6, and a second A/D converter 7. The following explanation is based on an example where an input signal of the A/D converter circuit is a voltage signal, but the input signal may be replaced by a current signal.

The amplifier circuit 1 is inputted with an input signal $V_{in}$. The amplifier circuit 1 amplifies the input signal $V_{in}$ inputted thereto, and outputs a first amplification signal $V_1$ and a second amplification signal $V_2$. When the amplifier circuit 1 has an amplification factor of Gv, the ideal amplification signal of the amplifier circuit 1 is $V_{in} \times Gv$. The first amplification signal $V_1$ is a signal obtained by amplifying the input signal $V_{in}$ coarsely, and its amplification error from the ideal amplification signal $V_{in} \times Gv$ is larger than that in the second amplification signal $V_2$. The second amplification signal $V_2$ is a signal obtained by amplifying the input signal $V_{in}$ more finely (with higher accuracy), and its amplification error from the ideal amplification signal $V_{in} \times Gv$ is smaller than that in the first amplification signal $V_1$.

The amplifier circuit 1 is controlled by control signals $\phi_3$ and $\phi_4$. The control signals $\phi_3$ and $\phi_4$ are clock signals. The amplifier circuit 1 amplifies the input signal $V_{in}$ while the control signals $\phi_3$ and $\phi_4$ are H (High). Hereinafter, a period during which the control signal $\phi_i$ is H is referred to as Phase i. The first amplification signal $V_1$ is an amplification signal at the end of Phase 3, and the second amplification signal $V_2$ is an amplification signal at the end of Phase 4. Note that the configuration of the amplifier circuit 1 will be mentioned in detail later.

The first sampling circuit 2 is inputted with the first amplification signal $V_1$ outputted by the amplifier circuit 1. The first sampling circuit 2 samples the first amplification signal $V_1$ inputted thereto. The first sampling circuit 2 is formed using e.g. a switched capacitor circuit having a sampling capacitor.

The first sampling circuit 2 is controlled by the control signal $\phi_3$. The first sampling circuit 2 samples the first amplification signal $V_1$ during Phase 3. Then, the first sampling circuit 2 holds the first amplification signal $V_1$ sampled at the end of Phase 3, and outputs it.

The first A/D converter 3 (ADC 1) is inputted with the output signal of the first sampling circuit 2, which is i.e. the first amplification signal $V_1$ sampled by the first sampling circuit 2 at the end of Phase 3. The first A/D converter 3 performs A/D conversion on the first amplification signal $V_1$ inputted thereto, and outputs a first digital signal $D_1$. The first digital signal $D_1$ corresponds to a result of A/D conversion on the upper bits of the input signal $V_{IN}$.

The first A/D converter 3 is controlled by the control signal $\phi_4$. The first A/D converter 3 performs A/D conversion on the first amplification signal $V_1$ during Phase 4. The following is based on the definition that the first A/D converter 3 has a resolution of M bits, and the first digital signal $D_1$ is an M-bit digital signal.

The second sampling circuit 4 is inputted with the second amplification signal $V_2$ outputted by the amplifier circuit 1. The second sampling circuit 4 samples the second amplification signal $V_2$ inputted thereto. The second sampling circuit 4 is formed using e.g. a switched capacitor circuit having a sampling capacitor.

The second sampling circuit 4 is controlled by the control signal $\phi_4$. The second sampling circuit 4 samples the second amplification signal $V_2$ during Phase 4. Then, the second sampling circuit 4 holds the second amplification signal $V_2$ sampled at the end of Phase 4, and outputs it.

The D/A converter 5 (DAC) is inputted with the first digital signal $D_1$ outputted by the first A/D converter 3. The D/A converter 5 performs D/A conversion on the first digital signal $D_1$ inputted thereto, and outputs a first analog signal $A_1$. The D/A converter 5 may be a capacitor DAC, or may be a resistance DAC. The D/A converter 5 has a resolution of M bits.

The subtracter 6 is inputted with the output signal of the second sampling circuit 4, which is i.e. the second amplification signal $V_2$ sampled by the second sampling circuit 4 at the end of Phase 4, and the first analog signal $A_1$ outputted by the D/A converter 5. The subtracter 6 subtracts the first analog signal $A_1$ from the second amplification signal $V_2$, and outputs a second analog signal $A_2$. The second analog signal $A_2$ corresponds to a residual signal obtained by subtracting the result of A/D conversion on the upper bits from the input signal $V_{in}$.

The second A/D converter 7 (ADC 2) is inputted with the second analog signal $A_2$ outputted by the subtracter 6. The second A/D converter 7 performs A/D conversion on the second analog signal $A_2$ inputted thereto, and outputs a second digital signal $D_2$. The second digital signal $D_2$ corresponds to a result of A/D conversion on the lower bits of the input signal $V_{in}$.

The second A/D converter 7 is controlled by control signals $\phi_1$ to $\phi_3$. The second A/D converter 7 performs A/D conversion on the second analog signal $A_2$ during Phases 1 to 3. The following is based on the definition that the second A/D converter 7 has a resolution of L bits, and the second digital signal $D_2$ is an L-bit digital signal.

In the A/D converter circuit according to the present embodiment, the sum of the first digital signal $D_1$ and second digital signal $D_2$ is treated as a result of A/D conversion on the input signal $V_{in}$. The sum of the first digital signal $D_1$ and second digital signal $D_2$ should be obtained by a digital circuit in the post-stage.

Note that each of the first A/D converter 3 and second A/D converter 7 is e.g. a flash A/D converter, a successive approximation A/D converter, a pipeline A/D converter, a delta-sigma A/D converter, etc., but should not be limited thereto. Further, it is desirable that the resolution M of the first A/D converter 3 is smaller than the resolution L of the second A/D converter 7, which is because the first amplification signal $V_1$ has a larger amplification error compared to the second amplification signal $V_2$.

Figure 2:
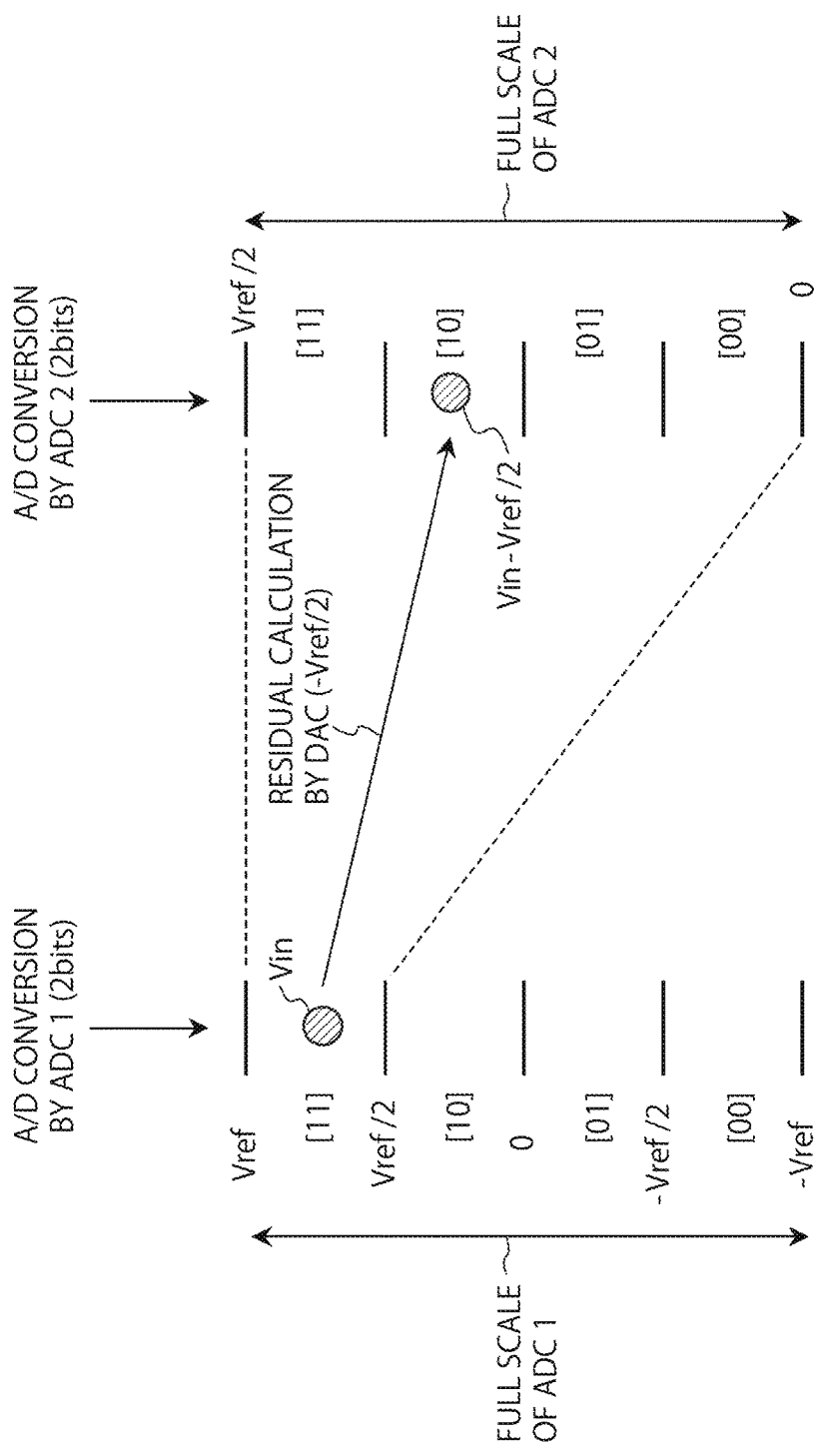
FIG. 2 is a diagram explaining the operation of a sub-range A/D converter.

In the A/D converter circuit according to the present embodiment, the first A/D converter 3, D/A converter 5, subtracter 6, and second A/D converter 7 operate similarly to a general sub-range A/D converter. FIG. 2 is a schematic diagram explaining the operation of a sub-range A/D converter.

In the example of FIG. 2, the sub-range A/D converter is formed using an ADC 1 having a resolution of 2 bits (corresponding to the first A/D converter 3), a DAC (corresponding to the D/A converter 5 and subtracter 6), and an ADC 2 having a resolution of 2 bits (corresponding to the second A/D converter 7). The ADC 1 has a full scale of −Vref to Vref, and the ADC 2 has a full scale of 0 to Vref/2.

When this sub-range A/D converter is inputted with the input signal $V_{in}$, the ADC 1 performs coarse 2-bit A/D conversion first. In the example of FIG. 2, the ADC 1 outputs [11] corresponding to a value equal to or greater than Vref/2 and equal to or less than Vref, as a result of A/D conversion. The output of the ADC 1 corresponds to a result of A/D conversion on the upper bits of the input signal $V_{in}$.

Next, the DAC performs residual calculation of subtracting the result of A/D conversion performed by the ADC 1 from the input signal $V_{in}$. The amount to be subtracted by the DAC is determined by the result of A/D conversion performed by the ADC 1. The DAC performs residual calculation so that the residual value falls within the full scale of the ADC 2.

In the example of FIG. 2, the DAC subtracts Vref/2 from $V_{in}$ based on [11] as a result of A/D conversion. Accordingly, the ADC 2 is inputted with $V_{in}$-Vref/2.

Then, the ADC 2 performs fine 2-bit A/D conversion. In the example of FIG. 2, the ADC 2 outputs [10] corresponding to a value equal to or greater than Vref/4 and equal to or less than 3Vref/8, as a result of A/D conversion. The output of the ADC 2 corresponds to a result of A/D conversion on the lower bits of the input signal $V_{in}$.

Consequently, the result of A/D conversion performed by this sub-range A/D converter on the input signal $V_{in}$ becomes As mentioned above, in the A/D converter circuit according to the present embodiment, the first A/D converter 3 operates as the ADC 1, the combination of the D/A converter 5 and subtracter 6 operates as the DAC, and the second A/D converter 7 operates as the ADC 2.

Figure 3:
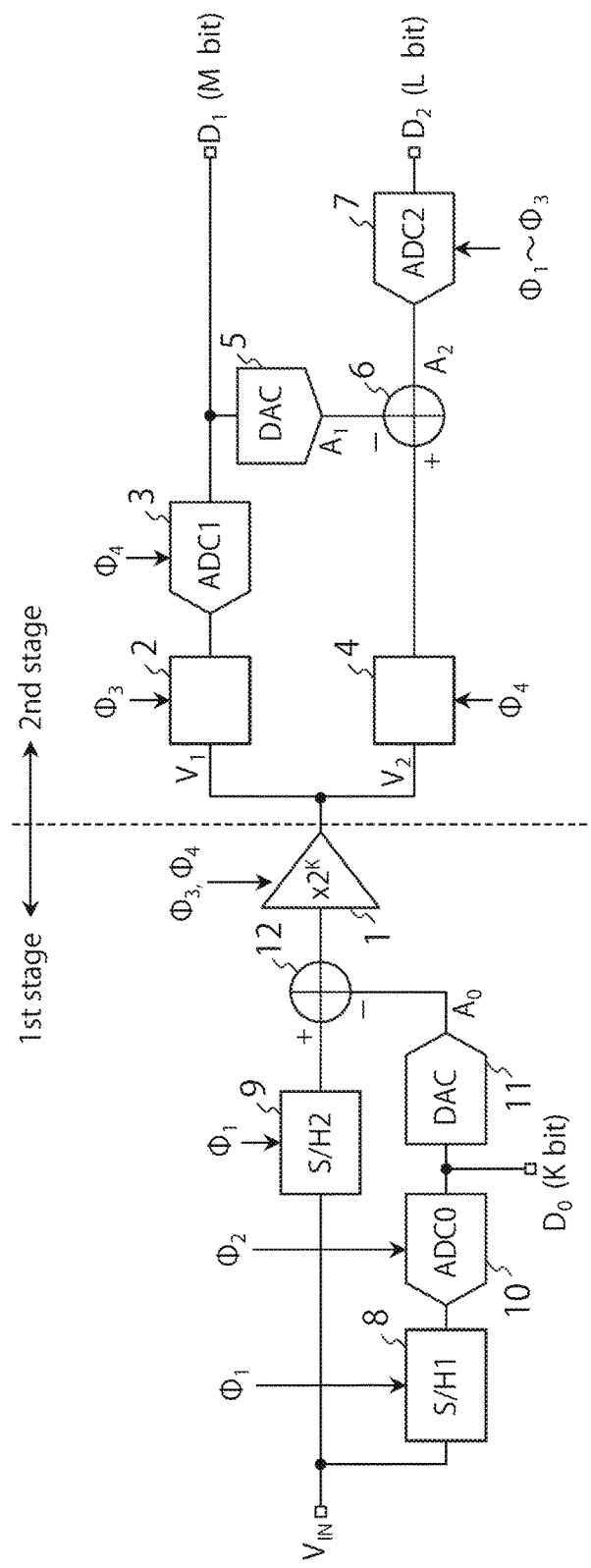
FIG. 3 is a diagram showing an example of a pipeline A/D converter having the A/D converter circuit according to the first embodiment.

Next, the operation of the A/D converter circuit according to the present embodiment will be explained referring to FIGS. 3 and 4. FIG. 3 is a diagram showing an example of a pipeline A/D converter having the A/D converter circuit according to the present embodiment. In the example of FIG. 3, the pipeline A/D converter has two pipeline stages, which are i.e. a first stage and a second stage.

The first stage has a sample-and-hold circuit 8 (S/H 1), a sample-and-hold circuit 9 (S/H 2), an A/D converter 10 (ADC 0), a D/A converter 11 (DAC), a subtracter 12, and the amplifier circuit 1 of the A/D converter circuit according to the present embodiment.

The sample-and-hold circuits 8 and 9 are connected in parallel and controlled by the control signal φ to sample an input signal $V_{IN}$ of the pipeline A/D converter during Phase 1. Then, each of the sample-and-hold circuits 8 and 9 holds the sampled input signal $V_{IN}$ and outputs it.

The A/D converter 10 is controlled by the control signal $\phi_2$, and performs A/D conversion on the input signal $V_{IN}$ sampled by the sample-and-hold circuit 8 to output a digital signal $D_0$ during Phase 2. It is defined that the A/D converter 10 has a resolution of K bits, and the digital signal $D_0$ is a K-bit digital signal. The A/D converter 10 is e.g. a flash A/D converter, a successive approximation A/D converter, etc., but should not be limited thereto.

The D/A converter 11 performs D/A conversion on the digital signal $D_0$ outputted by the A/D converter 10, and outputs an analog signal $A_0$.

The subtracter 12 outputs a residual signal by subtracting the analog signal $A_0$ outputted by the D/A converter 11 from the input signal $V_{IN}$ sampled by the sample-and-hold circuit 9. The residual signal outputted by the subtracter 12 corresponds to the input signal $V_{in}$ of the amplifier circuit 1 according to the present embodiment.

Figure 4:
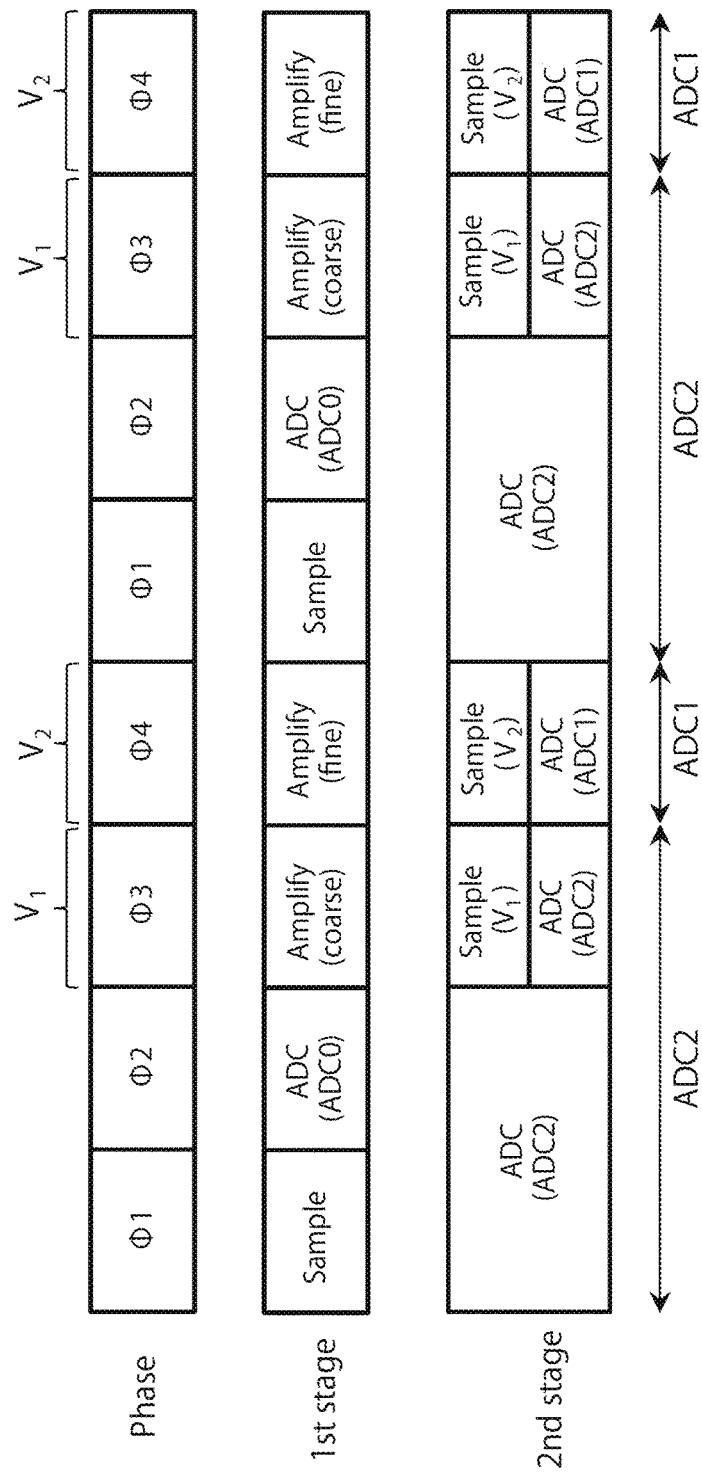
FIG. 4 is a timing chart showing the operation of the A/D converter circuit according to the first embodiment.

FIG. 4 is a timing chart showing the operation of the pipeline A/D converter of FIG. 3. As shown in FIG. 4, the pipeline A/D converter of FIG. 3 has four Phases 1 to 4 corresponding to the control signals $\phi_1$ to $\phi_4$, respectively. That is, Phases 1 to 4 correspond to one cycle operation. In the following, operation to be performed when the first cycle is started will be explained as an example.

First, in Phase 1, each of the sample-and-hold circuits 8 and 9 in the first stage samples the input signal $V_{IN}$. Each of the sample-and-hold circuits 8 and 9 holds the input signal $V_{IN}$ sampled at the end of Phase 1.

Next, in Phase 2, the A/D converter 10 (ADC 0) performs A/D conversion on the input signal $V_{IN}$ outputted by the sample-and-hold circuit 8, and outputs the K-bit digital signal Do. Further, the D/A converter 11 performs D/A conversion on the digital signal $D_0$, and outputs the analog signal $A_0$. Further, the subtracter 12 subtracts the analog signal $A_0$ from the input signal $V_{IN}$ outputted by the sample-and-hold circuit 9, and outputs a residual signal $V_{in}$. The sample-and-hold circuit 9 holds the residual signal $V_{in}$ at the end of Phase 2.

After that, in Phase 3, the amplifier circuit 1 amplifies the residual signal $V_{in}$ coarsely, and outputs the first amplification signal $V_1$. In the example of FIG. 3, since the A/D converter 10 in the first stage has a resolution of K bits, the amplifier circuit 1 has an amplification factor of $2^K$. In this case, the first amplification signal $V_1$ is a signal made coarsely approach to $V_{in} \times 2^K$.

In addition, in Phase 3, the first sampling circuit 2 in the second stage samples the first amplification signal $V_1$ outputted by the amplifier circuit 1. The first sampling circuit 2 holds the first amplification signal $V_1$ sampled at the end of Phase 3.

Then, in Phase 4, the amplifier circuit 1 amplifies the residual signal $V_{in}$ finely (with high accuracy), and outputs the second amplification signal $V_2$. Further, the second sampling circuit 4 in the second stage samples the second amplification signal $V_2$ outputted by the amplifier circuit 1. The second sampling circuit 4 holds the second amplification signal $V_2$ sampled at the end of Phase 4.

In addition, in Phase 4, the first A/D converter 3 (ADC 1) in the second stage performs A/D conversion on the first amplification signal $V_1$ outputted by the first sampling circuit 2, and outputs the M-bit first digital signal $D_1$. The first digital signal $D_1$ corresponds to a result of A/D conversion on the upper bits in the second stage. Further, the D/A converter 5 performs D/A conversion on the digital signal $D_1$, and outputs the first analog signal $A_1$. Further, the subtracter 6 subtracts the first analog signal $A_1$ from the second amplification signal $V_2$ outputted by the second sampling circuit 4, and outputs the second analog signal $A_2$. The second analog signal $A_2$ corresponds to a residual signal in the second stage. The second sampling circuit 4 holds the analog signal $A_2$ at the end of Phase 4.

Operation for the first cycle ends at this point, and operation for the second cycle starts. Operation in the first stage is performed similarly to the first cycle. On the other hand, in the second stage, in the first to third phases of the second cycle, the second A/D converter 7 (ADC 2) performs A/D conversion on the second analog signal $A_2$ outputted by the second sampling circuit 4, and outputs the L-bit second digital signal $D_2$. The second digital signal $D_2$ corresponds to a result of A/D conversion on the lower bits in the second stage.

At this point, the A/D conversion performed on the input signal $V_{IN}$ by the pipeline A/D converter of FIG. 3 for the first cycle ends. The input signal $V_{IN}$ is converted into N(=K+M+L) bits through the A/D conversion.

Subsequent operation in the second stage is performed similarly to the first cycle. For example, in Phase 3, the first sampling circuit 2 samples the first amplification signal $V_1$ depending on the input signal $V_{IN}$ in the second cycle.

As explained above, in the A/D converter circuit according to the present embodiment, the first A/D converter 3 performs A/D conversion on the upper bits in Phase 4, and the second A/D converter 7 performs A/D conversion on the lower bits in Phases 1 to 3. That is, the A/D converter circuit according to the present embodiment can perform A/D conversion continuously during Phases 1 to 4.

This is because the first amplification signal $V_1$ is sampled by the first sampling circuit 2 in the operation phase different from the operation phase for the second sampling circuit 4 to sample the second amplification signal $V_2$. As shown in FIG. 4, the first amplification signal $V_1$ is sampled in Phase 3, and the second amplification signal $V_2$ is sampled in Phase 4.

As a result, the A/D converter circuit according to the present embodiment does not suffer from overhead in the sampling period. Therefore, in the A/D converter circuit according to the present embodiment, the time during which A/D conversion can be performed (available conversion time) gets longer compared to a conventional A/D converter circuit which cannot perform A/D conversion during the sampling period.

In a conventional A/D converter circuit having a short available conversion time, when an A/D converter (e.g. successive approximation A/D converter) requiring long A/D conversion time is used as the second A/D converter 7, it is necessary, due to the lack of available conversion time, to lengthen the available conversion time in order to secure the A/D conversion time for the second A/D converter 7. As a result, the conventional A/D converter circuit requires long A/D conversion time.

On the other hand, in the A/D converter circuit according to the present embodiment does not cause the lack of available conversion time even when an A/D converter requiring long A/D conversion time is used as the second A/D converter 7. Consequently, the A/D conversion time required for the A/D converter circuit according to the present embodiment becomes shorter than that for the conventional A/D converter circuit. Therefore, the A/D converter circuit according to the present embodiment can perform A/D conversion at high speed in a short A/D conversion time.

Further, in the conventional A/D converter circuit, an amplification phase and a conversion phase are provided by two clock signals having a duty ratio of 1:1. In such an A/D converter circuit, the conversion phase can be lengthened equivalently by changing the duty ratio of the clock signals. That is, the available conversion time can be lengthened without changing the time for the first cycle.

However, there is a problem that a duty changing circuit for changing the duty ratio of the clock signals consumes a large amount of power. On the other hand, in the present embodiment, the available conversion time can be lengthened without changing the duty ratio of the clock signals. Therefore, the present embodiment makes it possible to restrain the increase in power consumption while increasing the speed of the A/D converter circuit.

Note that, in the above explanation, the second A/D converter 7 performs A/D conversion during Phases 1 to 3, but the second A/D converter 7 may perform A/D conversion during a partial period in Phases 1 to 3. Further, the A/D converter 10 of FIG. 3 may perform A/D conversion not in Phase 2 but at the start of Phase 3. In this case, the sample-and-hold circuits 8 and 9 may sample the input signal $V_{IN}$ in Phases 1 and 2. Further, the pipeline A/D converter may have three or more pipeline stages.

Hereinafter, examples of the amplifier circuit 1 will be explained.

First Example

Figure 5:
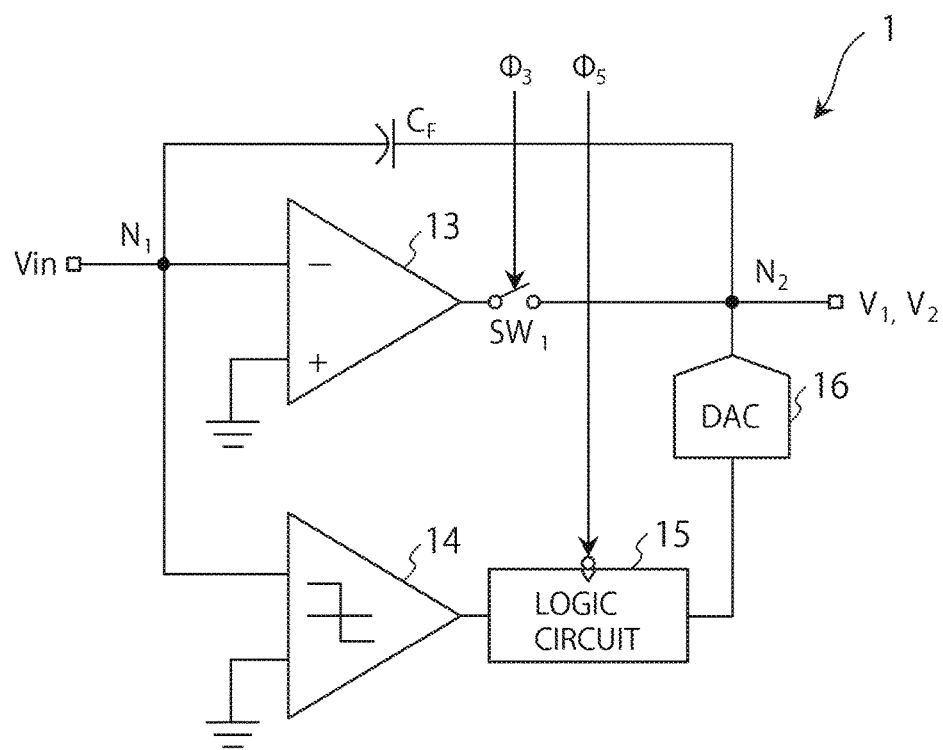
FIG. 5 is a diagram showing a first example of an amplifier circuit.

A first example of the amplifier circuit 1 will be explained referring to FIGS. 5 and 6. FIG. 5 is a diagram showing an example of the amplifier circuit 1 according to the present example. As shown in FIG. 5, the amplifier circuit 1 is a successive approximation amplifier having an operational amplifier, and has an operational amplifier 13, a feedback capacitor $C_F$, a switch $SW_1$, a comparator 14, a logic circuit 15, and a DAC 16. The comparator 14, logic circuit 15, and DAC 16 are included in a successive approximation circuit.

The operational amplifier 13 has an inverting input terminal connected to a node $N_1$, a non-inverting input terminal connected to a reference voltage line, and an output terminal connected to one end of the switch $SW_1$. The node $N_1$ corresponds to an input terminal of the amplifier circuit 1 inputted with the input signal $V_{in}$. The reference voltage line is e.g. a ground line. The gain of the operational amplifier 13 is defined as A.

The feedback capacitor CF has one end connected to the node $N_1$ and the other end connected to a node $N_2$. The node $N_2$ corresponds to an output terminal of the amplifier circuit 1 outputting the amplification signals $V_1$ and $V_2$.

The switch $SW_1$ has one end connected to the output terminal of the operational amplifier 13 and the other end connected to the node $N_2$. The switch $SW_1$ is controlled by the control signal $\phi_3$, and turned on during Phase 3.

The comparator 14 has one end connected to the node $N_1$ and the other end connected to a reference voltage line. The comparator 14 outputs, from its output terminal, a result of comparison between a voltage $V_X$ of the node $N_1$ and a reference voltage.

The logic circuit 15 has an input terminal connected to the output terminal of the comparator 14 and an output terminal connected to an input terminal of the DAC 16. The logic circuit 15 controls the DAC 16 depending on the comparison result inputted from the comparator 14. The logic circuit 15 is controlled by a control signal $\phi_5$. The control signal $\phi_5$ is a clock signal turning on and off at predetermined time intervals during Phase 4.

The DAC 16 has an input terminal connected to the output terminal of the logic circuit 15 and an output terminal connected to the node $N_2$. The DAC 16 is controlled by the logic circuit 15, and outputs an analog signal depending on the comparison result, by which the output signal of the node $N_2$ is controlled.

Figure 6:
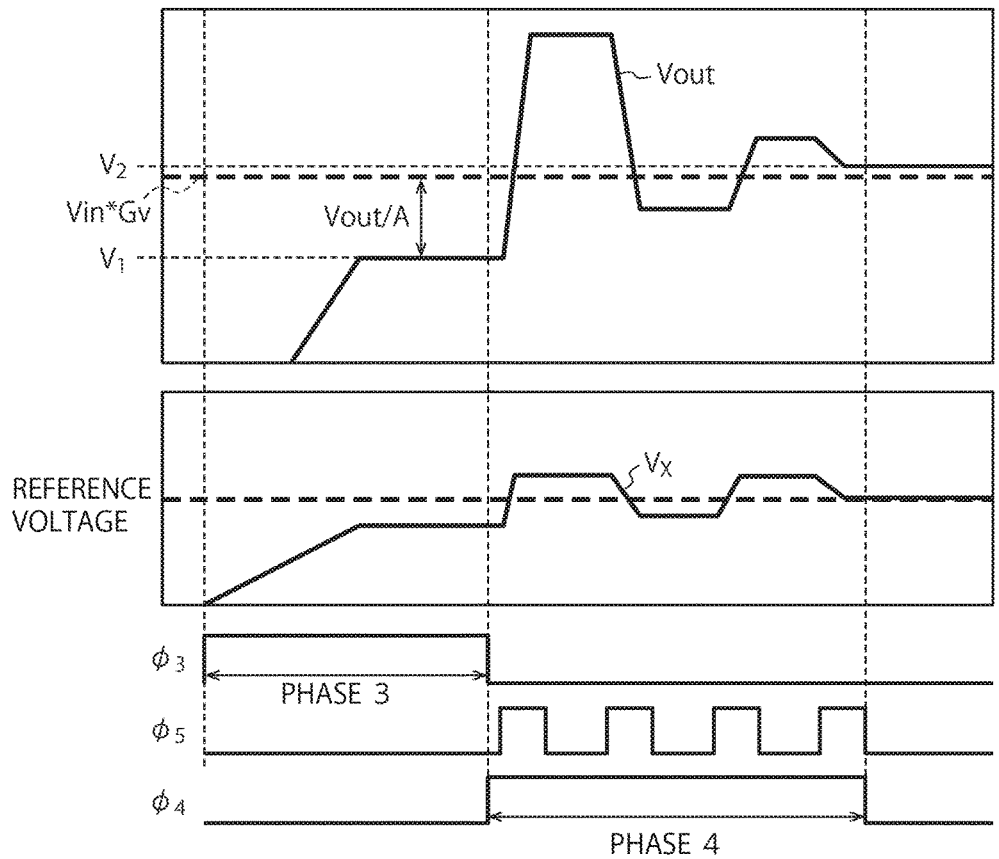
FIG. 6 is a diagram showing the operation of the amplifier circuit of FIG. 5.

FIG. 6 is a diagram showing the operation of the amplifier circuit 1 of FIG. 5. First, in Phase 3, the switch $SW_1$ is turned on, and the input signal $V_{in}$ is amplified by the operational amplifier 13. As shown in FIG. 6, an output signal $V_{out}$ of the amplifier circuit 1 at the end of Phase 3 is sampled by the first sampling circuit 2 as the first amplification signal $V_1$. Due to the nature of the operational amplifier, the first amplification signal $V_1$ has an amplification error of $V_{out}/A$ from the ideal amplification signal $V_{in} \times Gv$.

Next, in Phase 4, the switch $SW_1$ is turned off, the logic circuit 15 is inputted with the control signal $\phi_5$, and the successive approximation circuit performs successive approximation. That is, the comparator 14 compares the voltage $V_X$ with the reference voltage, the logic circuit 15 controls the DAC 16 to make the voltage $V_X$ approach to the reference voltage based on the comparison result, and the DAC 16 outputs an analog signal to control the output signal $V_{out}$.

The successive approximation circuit repeats such successive approximation each time the control signal $\phi 5$ becomes H. This makes the voltage $V_X$ approach asymptotically to the reference voltage, and consequently, the output signal $V_{out}$ approaches asymptotically to the ideal amplification signal $V_{in} \times Gv$. Then, the output signal $V_{out}$ at the end of Phase 4 is sampled by the second sampling circuit 4 as the second amplification signal $V_2$.

The amplification error between the second amplification signal $V_2$ and the ideal amplification signal $V_{in} \times Gv$ is settled within the LSB of the DAC 16. This amplification error becomes smaller than the amplification error ($V_{out}/A$) in the first amplification signal $V_1$.

As explained above, the amplifier circuit 1 can be formed using the operational amplifier 13 having a successive approximation circuit. The first amplification signal $V_1$ becomes the output signal $V_{out}$ before undergoing the successive approximation, and the second amplification signal $V_2$ becomes the output signal $V_{out}$ after undergoing the successive approximation.

Note that, in the present example, the control signal $\phi_5$ may be a clock signal different from the control signal $\phi_4$, or may be a clock signal generated from the control signal $\phi_4$.

Second Example

Figure 7:
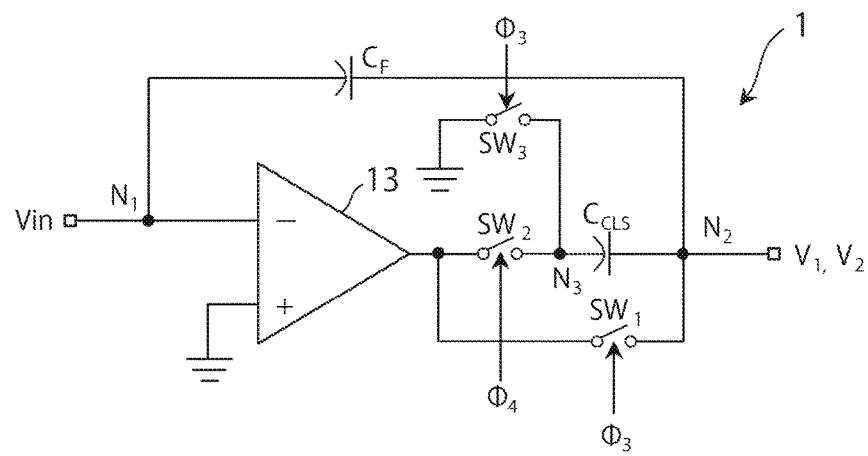
FIG. 7 is a diagram showing a second example of the amplifier circuit.

A second example of the amplifier circuit 1 will be explained referring to FIGS. 7 and 8. FIG. 7 is a diagram showing an example of the amplifier circuit 1 according to the present example. As shown in FIG. 7, the amplifier circuit 1 is a CLS (Correlated Level Shifting) amplifier having an operational amplifier, and has the operational amplifier 13, the feedback capacitor CF, a level-shifting capacitor CCLS, and switches $SW_1$ to $SW_3$. The operational amplifier 13, switch $SW_1$, and feedback capacitor CF function similarly to the first example.

The switch $SW_2$ has one end connected to the output terminal of the operational amplifier 13 and the other end connected to a node $N_3$. The switch $SW_2$ is controlled by the control signal $\phi_4$, and turned on during Phase 4.

The switch $SW_3$ has one end connected to the node $N_3$ and the other end connected to a reference voltage line. The switch $SW_3$ is controlled by the control signal $\phi_3$, and turned on during Phase 3.

The level-shifting capacitor $C_{CLS}$ has one end connected to the node $N_3$ and the other end connected to the node $N_2$. The level-shifting capacitor $C_{CLS}$ shifts the level of the output signal $V_{out}$ of the amplifier circuit 1 in Phase 4.

Figure 8:
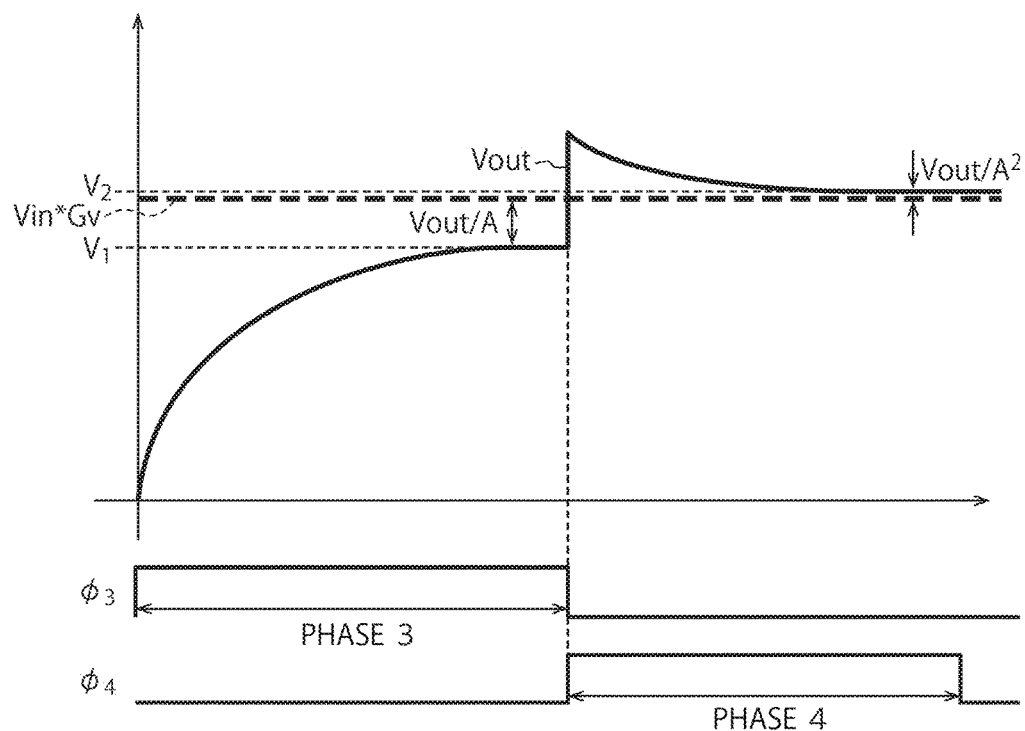
FIG. 8 is a diagram showing the operation of the amplifier circuit of FIG. 7.

FIG. 8 is a diagram showing the operation of the amplifier circuit 1 of FIG. 7. First, in Phase 3, the switch $SW_1$ is turned on, and the input signal $V_{in}$ is amplified by the operational amplifier 13. As shown in FIG. 8, the output signal $V_{out}$ of the amplifier circuit 1 at the end of Phase 3 is sampled by the first sampling circuit 2 as the first amplification signal $V_1$. Due to the nature of the operational amplifier 13, the first amplification signal $V_1$ has an amplification error of $V_{out}/A$ from the ideal amplification signal $V_{in} \times Gv$.

Next, in Phase 4, the switch SW1 is turned off, and the switches SW2 and SW3 are turned on. As a result, the level of the output signal Vout is shifted as shown in FIG. 8. After that, based on the output signal Vout after undergoing the level-shifting, the operational amplifier 13 amplifies the input signal $V_{in}$. This makes the output signal $V_{out}$ approach asymptotically to the ideal amplification signal $V_{in} \times Gv$. Then, the output signal Vout at the end of Phase 4 is sampled by the second sampling circuit 4 as the second amplification signal $V_2$.

The second amplification signal $V_2$ has an amplification error of $V_{in}/A_2$ from the ideal amplification signal $V_{in} \times Gv$. This amplification error becomes smaller than the amplification error ($V_{out}/A$) in the first amplification signal $V_1$.

As explained above, the amplifier circuit 1 can be formed using a CLS amplifier. The first amplification signal $V_1$ becomes the output signal $V_{out}$ before undergoing the level-shifting, and the second amplification signal $V_2$ becomes the output signal $V_{out}$ after undergoing the level-shifting.

Third Example

A third example of the amplifier circuit 1 will be explained referring to FIGS. 9 and 10. In the first and second examples, the amplifier circuit 1 has two amplification phases, and amplifies the input signal $V_{in}$ in two stages. On the other hand, in the present example, the amplifier circuit 1 is a general inverting amplifier which amplifies the input signal $V_{in}$ in one stage.

Figure 9:
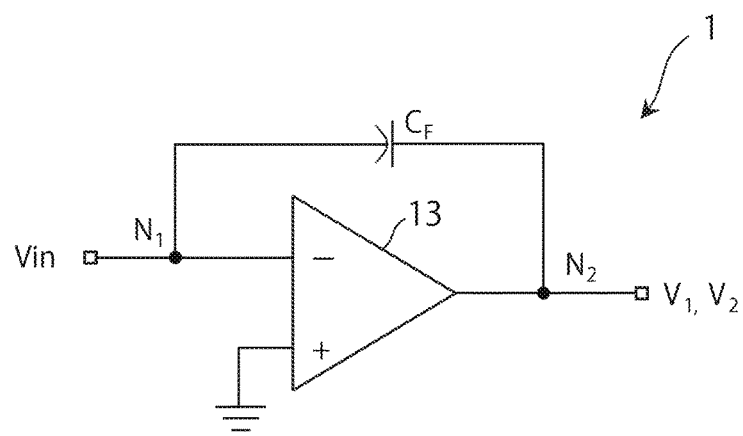
FIG. 9 is a diagram showing a third example of the amplifier circuit.

FIG. 9 is a diagram showing an example of the amplifier circuit 1 according to the present example. As shown in FIG. 9, the amplifier circuit 1 has the operational amplifier 13 and feedback capacitor $C_F$. The operational amplifier 13 and feedback capacitor $C_F$ function similarly to the second example.

Figure 10:
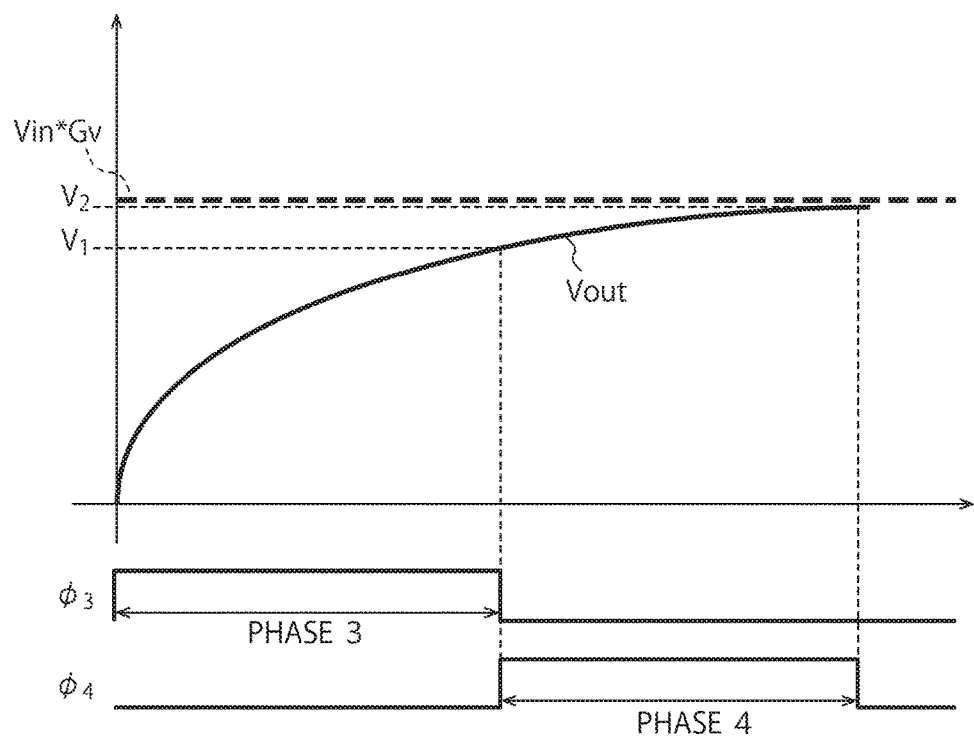
FIG. 10 is a diagram showing the operation of the amplifier circuit of FIG. 9.

FIG. 10 is a diagram showing the operation of the amplifier circuit 1 of FIG. 9. In the present example, as shown in FIG. 10, the output signal $V_{out1}$ at the end of Phase 3 is sampled by the first sampling circuit 2 as the first amplification signal $V_1$. Further, the output signal $V_{out2}$ at the end of Phase 4 is sampled by the second sampling circuit 4 as the second amplification signal $V_2$. As will be understood from FIG. 10, the amplification error in the second amplification signal $V_2$ becomes smaller than the amplification error in the first amplification signal $V_1$.

As explained above, the amplifier circuit 1 can be formed using a general amplifier circuit having the operational amplifier 13. In this case, the first amplification signal $V_1$ has an amplification error of $V_{out1}/A$, and the second amplification signal $V_2$ has an amplification error of $V_{out2}/A_2$.

Fourth Example

Figure 11:
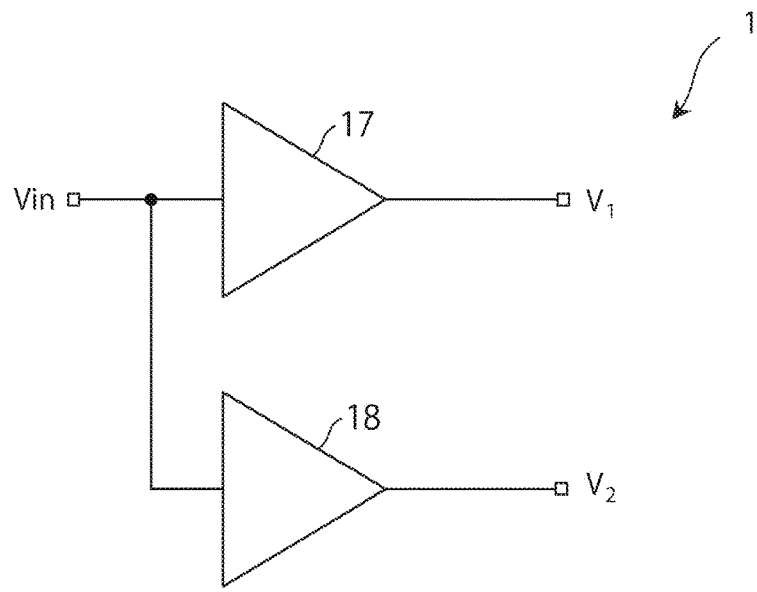
FIG. 11 is a diagram showing a fourth example of the amplifier circuit.

A fourth example of the amplifier circuit 1 will be explained referring to FIG. 11. In the first to third examples, the amplifier circuit 1 has one amplifier (operational amplifier). On the other hand, in the present example, the amplifier circuit 1 has two amplifiers. FIG. 11 is a diagram showing an example of the amplifier circuit 1 according to the present example. As shown in FIG. 11, the amplifier circuit 1 has amplifiers 17 and 18.

The amplifier 17 (first amplifier) is an amplifier arbitrarily selected, such as an operational amplifier. The amplifier 17 is inputted with the input signal $V_{in}$, amplifies the input signal $V_{in}$ inputted thereto, and outputs the output signal $V_{out}$. The output signal $V_{out}$ of the amplifier 17 at the end of Phase 3 is sampled by the first sampling circuit 2 as the first amplification signal $V_1$.

The amplifier 18 (second amplifier) is an amplifier arbitrarily selected, such as an operational amplifier. The amplifier 18 is inputted with the input signal $V_{in}$, amplifies the input signal $V_{in}$ inputted thereto, and outputs the output signal $V_{out}$. The output signal $V_{out}$ of the amplifier 18 at the end of Phase 4 is sampled by the second sampling circuit 4 as the second amplification signal $V_2$.

The amplifiers 17 and 18 may be of the same type or of different types. Further, the amplifiers 17 and 18 may be inputted with the same input signal $V_{in}$, or may be inputted with an offset input signal $V_{in}$. In any of these cases, the second amplification signal $V_2$ becomes a signal having a smaller amplification error compared to the first amplification signal $V_1$. In order to obtain such first amplification signal $V_1$ and second amplification signal $V_2$, it is desirable in the present example that the amplification accuracy of the amplifier 18 is higher than that of the amplifier 17.

As explained above, the amplifier circuit 1 can be formed using two amplifiers 17 and 18.

Second Embodiment

Figure 12:
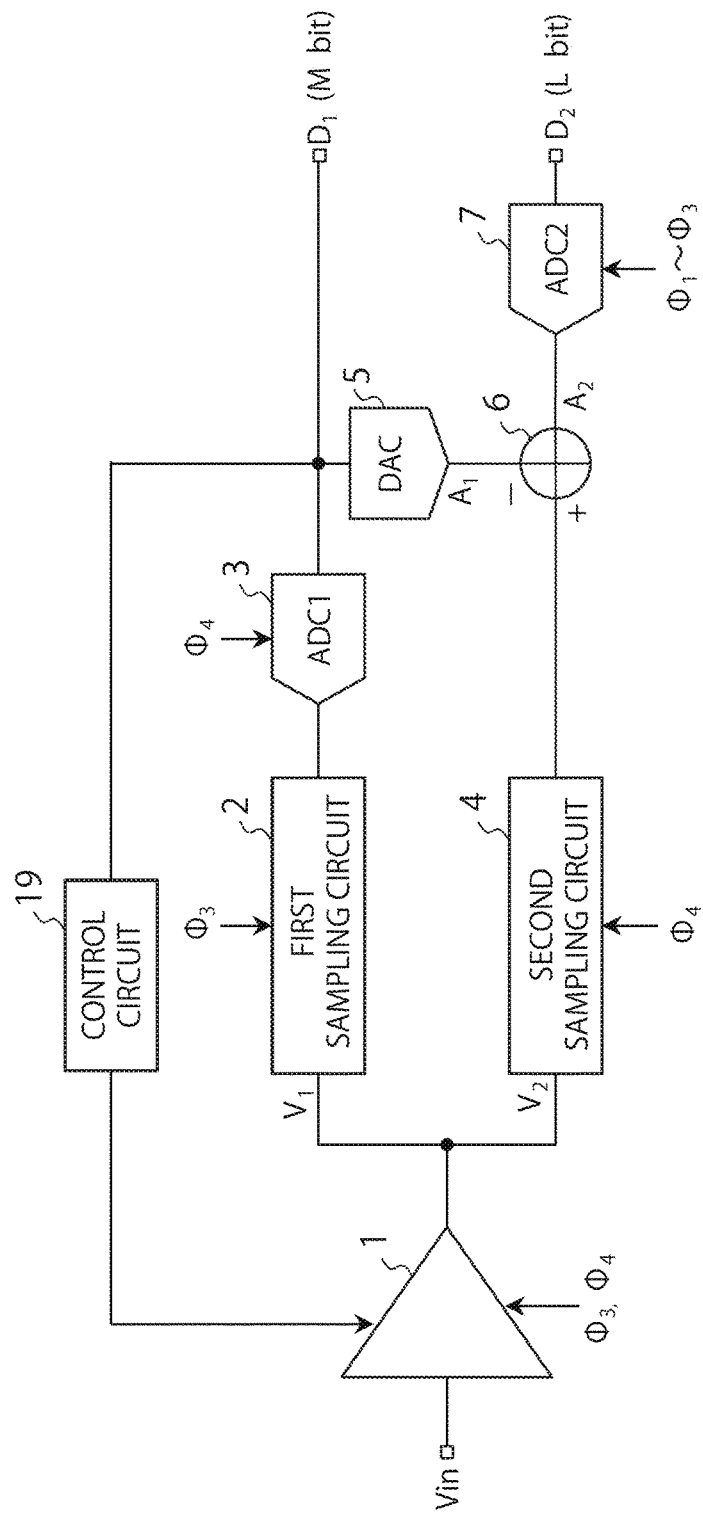
FIG. 12 is a diagram showing an example of an A/D converter circuit according to a second embodiment.

An A/D converter circuit according to a second embodiment will be explained referring to FIGS. 12 and 13. FIG. 12 is a diagram showing an example of the A/D converter circuit according to the present embodiment. As shown in FIG. 12, the A/D converter circuit according to the present embodiment has a control circuit 19. The other components are similar to those of the first embodiment.

The control circuit 19 is inputted with a result of A/D conversion (first digital signal $D_1$) from the first A/D converter 3. The control circuit 19 controls the amplifier circuit 1 based on the first digital signal $D_1$ inputted thereto.

As mentioned above, when the amplifier circuit 1 is formed using an operational amplifier, the output signal $V_{out}$ of the amplifier circuit 1 has an amplification error of $V_{out}/A$.

Figure 13:
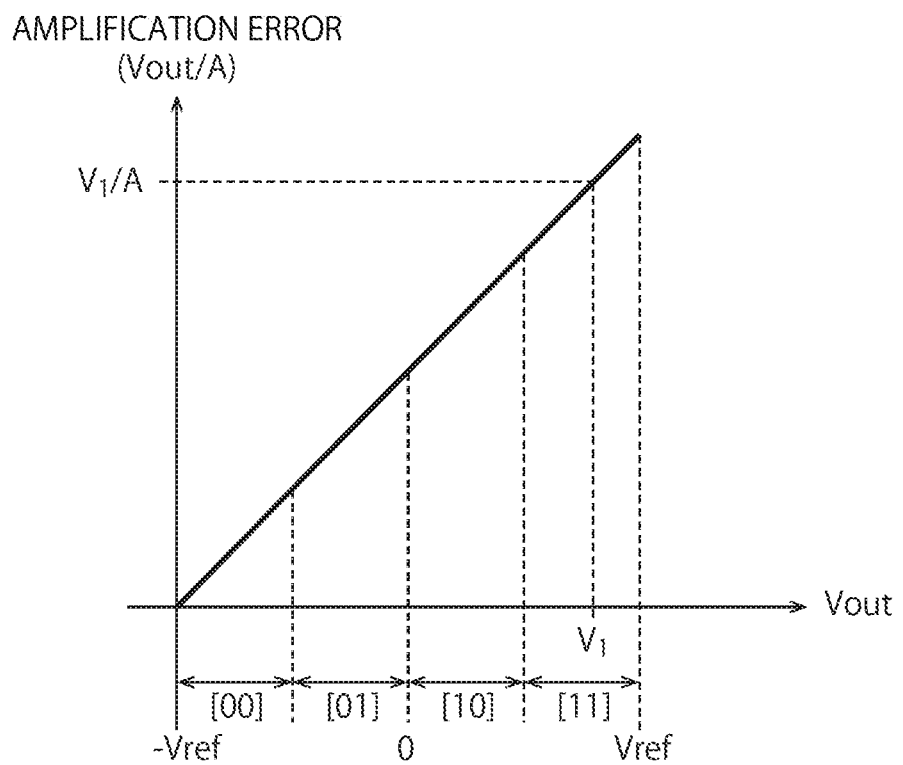
FIG. 13 is a diagram showing a relationship between an output signal of an amplifier circuit and an amplification error.

Therefore, as shown in FIG. 13, the amplification error in the first amplification signal $V_1$ becomes $V_1/A$.

Since the first digital signal $D_1$ is a result of A/D conversion on the first amplification signal $V_1$, the amplification error $V_1/A$ can be estimated based on the first digital signal $D_1$. For example, in the example of FIG. 13, when the first digital signal $D_1$ is [11], the amplification error is equal to or greater than Vref/2A and equal to or less than Vref/A.

Accordingly, the control circuit 19 controls the amplifier circuit 1 based on the first digital signal $D_1$. For example, in the case of the amplifier circuit 1 according to the first example, the frequency of successive approximation may be controlled based on the first digital signal $D_1$.

Concretely, the control circuit 19 is required to increase the frequency of successive approximation as the amplification error estimated from the first digital signal $D_1$ becomes larger, and reduce the frequency of successive approximation as the amplification error becomes smaller. This makes it possible to appropriately control the frequency of successive approximation of the amplifier circuit 1 and prevent the amplifier circuit 1 from performing unnecessary successive approximation, which leads to the reduction in the power consumption of the amplifier circuit 1.

Further, in the case of the amplifier circuit 1 according to the second and third examples, driving power of the operational amplifier 13 may be controlled based on the first digital signal $D_1$.

Concretely, the control circuit 19 is required to increase the driving power as the amplification error estimated from the first digital signal $D_1$ becomes larger, and reduce the driving power as the amplification error becomes smaller. This makes it possible to make the amplification error in the second amplification signal $V_2$ further smaller, which consequently improves the accuracy of A/D conversion performed by the A/D converter circuit.

Note that the control circuit 19 may control the amplifier circuit 1 based on the first amplification signal $V_1$ sampled by the first sampling circuit 2. The method of this control is as described above.

Third Embodiment

Figure 14:
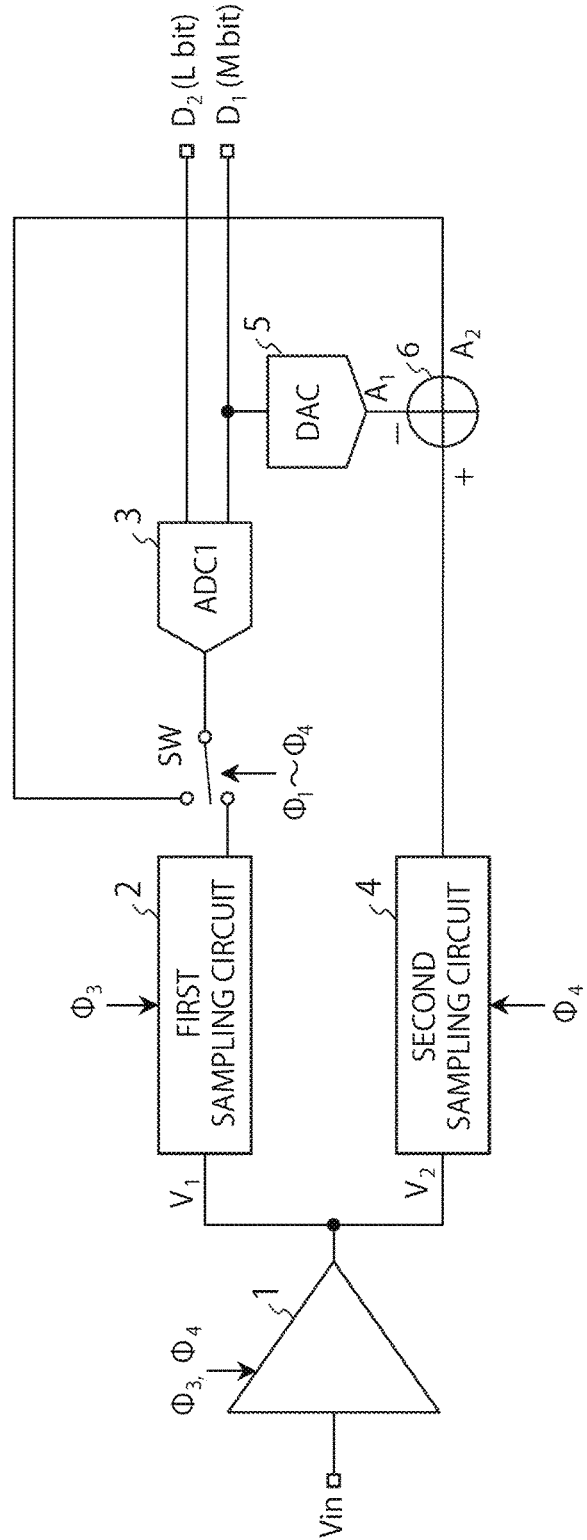
FIG. 14 is a diagram showing an example of an A/D converter circuit according to a third embodiment.

An A/D converter according to a third embodiment will be explained referring to FIG. 14. In the present embodiment, explanation will be given on an A/D converter circuit having the first A/D converter 3 which is used also as the second A/D converter 7. FIG. 14 is a diagram showing an example of the A/D converter circuit according to the present embodiment. As shown in FIG. 14, this A/D converter circuit has a switch SW and does not have the second A/D converter 7. The other components are similar to those of the first embodiment. Hereinafter, differences from the first embodiment will be mainly explained.

The switch SW has one end connected to an input terminal of the first A/D converter 3 and the other end connected to an output terminal of the first sampling circuit 2 or an output terminal of the subtracter 6. The switch SW is a switch capable of connecting the input terminal of the first A/D converter 3 to an output terminal of the first sampling circuit 2 or an output terminal of the subtracter 6. The switch SW is controlled by the control signals $\phi_1$ to $\phi_4$.

The switch SW is connected to the output terminal of the first sampling circuit 2 during Phase 4. Accordingly, the output terminal of the first sampling circuit 2 is connected to the input terminal of the first A/D converter 3. During Phase 4, the first A/D converter 3 is inputted with the first amplification signal $V_1$ from the first sampling circuit 2, performs A/D conversion on the first amplification signal $V_1$ inputted thereto, and outputs the first digital signal $D_1$. The outputted first digital signal $D_1$ is inputted into the D/A converter 5. This corresponds to the operation of the first A/D converter 3 in the first embodiment.

The switch SW is connected to the output terminal of the subtracter 6 during Phases 1 to 3. Accordingly, the output terminal of the subtracter 6 is connected to the input terminal of the first A/D converter 3. During Phases 1 to 3, the first A/D converter 3 is inputted with the second analog signal $A_2$ from the subtracter 6, performs A/D conversion on the second analog signal $A_2$ inputted thereto, and outputs the second digital signal $D_2$. This corresponds to the operation of the second A/D converter 7 in the first embodiment.

In this way, in the present embodiment, the first A/D converter 3 performs the operation of the first A/D converter 3 or second A/D converter 7 in the first embodiment depending on the switching of the switch SW. This enables one A/D converter to perform A/D conversion similarly to the first embodiment. According to the present embodiment, reducing one A/D converter makes it possible to reduce the circuit area of the A/D converter circuit.

Fourth Embodiment

An A/D converter circuit according to a fourth embodiment will be explained referring to FIGS. 15 and 16. In the present embodiment, explanation will be given on an A/D converter circuit when the second A/D converter 7 has redundancy.

In the A/D converter circuit in each of the above embodiments, there is a likelihood that an A/D conversion error arises in the first digital signal $D_1$ depending on the amplification error in the first amplification signal $V_1$. Such an A/D conversion error can be cancelled by letting the second A/D converter 7 have redundancy. In the present embodiment, the second A/D converter 7 has a redundancy of 0.5 bits. Here, FIG. 15 is a diagram explaining the operation of a sub-range A/D converter when the ADC 2 has redundancy.

Figure 15:
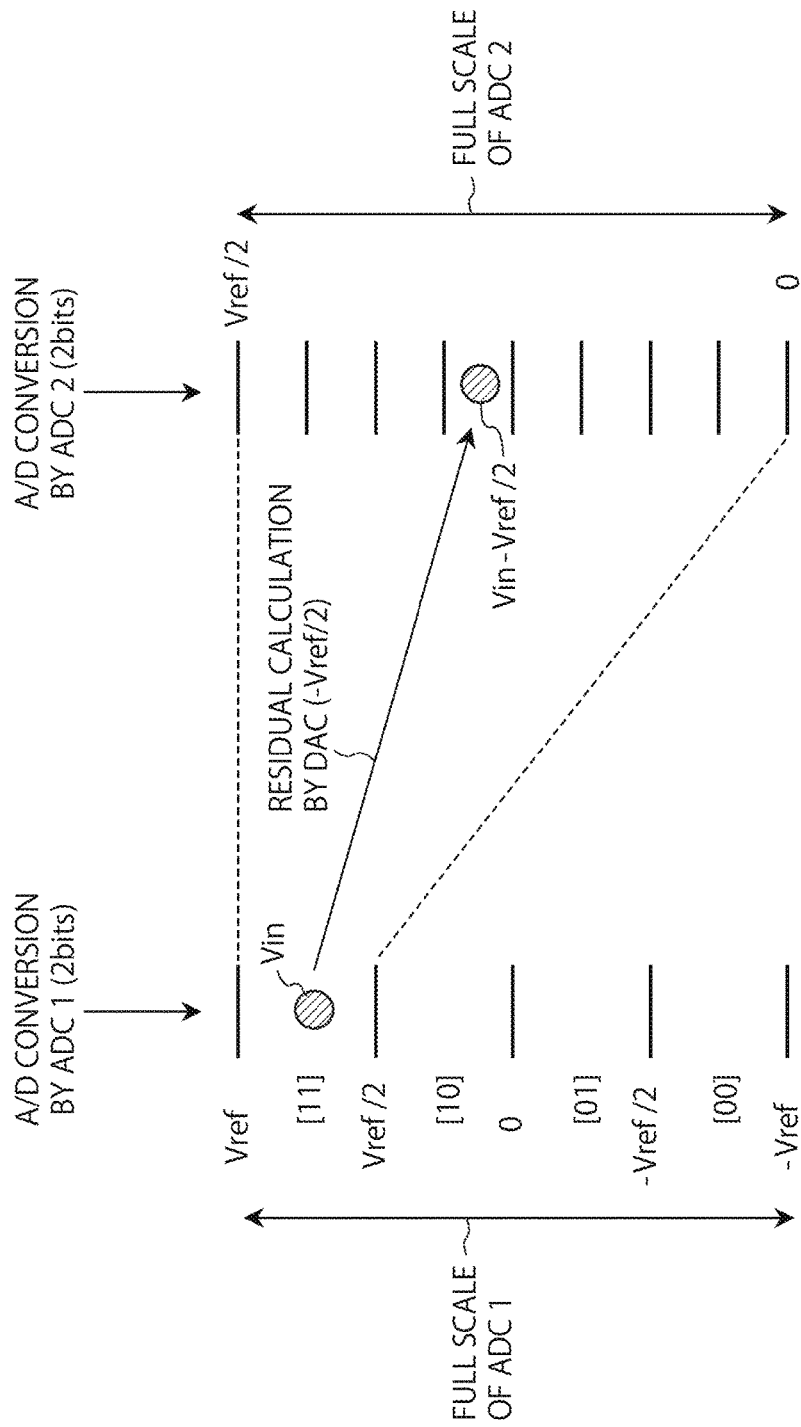
FIG. 15 is a diagram explaining the operation of a sub-range A/D converter having redundancy.

In the example of FIG. 15, the sub-range A/D converter is formed using an ADC 1 having a resolution of 2 bits (corresponding to the first A/D converter 3), a DAC (corresponding to the D/A converter 5 and subtracter 6), and an ADC 2 having a resolution of 2.5 bits (corresponding to the second A/D converter 7). The ADC 1 has a full scale of −Vref to Vref, and the ADC 2 has a full scale of −Vref/4 to 3Vref/4. That is, the full scale of the ADC 2 is broader than that of FIG. 2 by the LSB of the ADC 1.

In this way, when setting the full scale of the ADC 2 to bring an over range, the ADC 2 obtains redundancy. In the example of FIG. 15, the A/D converter circuit can normally perform A/D conversion on the input signal $V_{in}$ as long as an amplification error Verrormax in the first amplification signal $V_1$ satisfies the following formula.

$$Vref/4 > |V_{errormax}| \tag{1}$$

Figure 16:
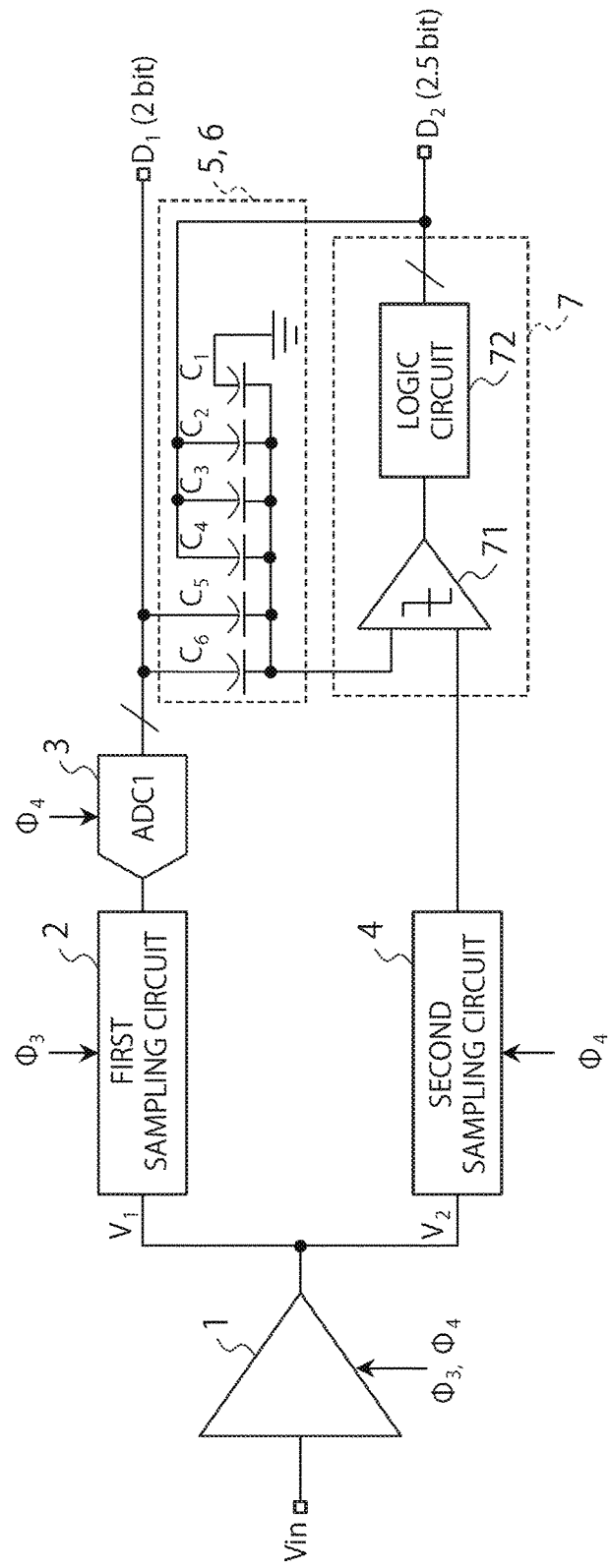
FIG. 16 is a diagram showing an example of an A/D converter circuit according to a fourth embodiment.

FIG. 16 is a diagram showing an example of the A/D converter circuit according to the present embodiment. In the example of FIG. 16, the second A/D converter 7 is a successive approximation A/D converter. Further, the first A/D converter 3 has a resolution of 2 bits, and the second A/D converter 7 has a resolution of 2.5 bits.

The DAC 5 and subtracter 6 are formed using a capacitor DAC having capacitors $C_1$ to $C_6$. Each of the capacitors $C_1$ and $C_2$ has a capacitance value of C, the capacitor $C_3$ has a capacitance value of 2C, each of the capacitors $C_4$ and $C_5$ has a capacitance value of 4C, and the capacitor $C_6$ has a capacitance value of 8C. In the example of FIG. 16, redundancy is realized by the capacitors $C_4$ and $C_5$ each having a capacitance value of 4C.

The second A/D converter 7 has a comparator 71 and a logic circuit 72.

The comparator 71 has one input terminal connected to the output terminal of the second sampling circuit 4, the other input terminal connected to an output terminal of the capacitor DAC, and an output terminal connected to the logic circuit 72. The comparator 71 outputs a result of comparison between the second amplification signal $V_2$ inputted from one input terminal and the output signal (second analog signal $A_2$) of the capacitor DAC inputted from the other input terminal.

The logic circuit 72 is inputted with the comparison result from the comparator 71, and outputs the second digital signal $D_2$ depending on the comparison result. The second digital signal $D_2$ outputted by the logic circuit 72 is fed back to the capacitor DAC.

In the A/D converter circuit of FIG. 16, the result of A/D conversion performed by the first A/D converter 3 (first digital signal $D_1$) is written in the capacitors $C_5$ and $C_6$ at the end of Phase 3. After that, in Phase 4, the comparator 71 compares the second analog signal $A_2$ with the second amplification signal $V_2$, and the logic circuit 72 rewrites the second digital signal $D_2$ depending on the comparison result. The second A/D converter 7 repeatedly rewrites the second digital signal $D_2$ until the second analog signal $A_2$ becomes smaller than the second amplification signal $V_2$, and the second digital signal $D_2$ finally obtained is treated as the result of A/D conversion. In the example of FIG. 16, $D_{ADC}$, which is the result of A/D conversion on the input signal $V_{in}$, can be expressed by the following formula.

$$D_{ADC}=8*D_1[1]+4*D_1[0]+4*D_2[2+2]*D_2[1]+D_2[0] \quad (2)$$

In Formula (2), $D_1[i]$ represents a value of the i-th bit of the first digital signal $D_1$, and $D_2[j]$ represents a value of the j-th bit of the second digital signal $D_2$. Such a calculation is performed by a digital circuit provided in the post-stage of the A/D converter circuit. The digital circuit performing the calculation of Formula (2) can be formed using a full adder and a half adder.

According to the present embodiment, redundancy of the second A/D converter 7 makes it possible to cancel the A/D conversion error caused by the amplification error in the first amplification signal $V_1$. Further, range mismatch between the D/A converter 5 and second A/D converter 7 can be prevented.

Furthermore, as shown in FIG. 16, using a successive approximation A/D converter as the second A/D converter 7 makes it possible to reduce the power consumption of the second A/D converter 7.

Fifth Embodiment

Figure 17:
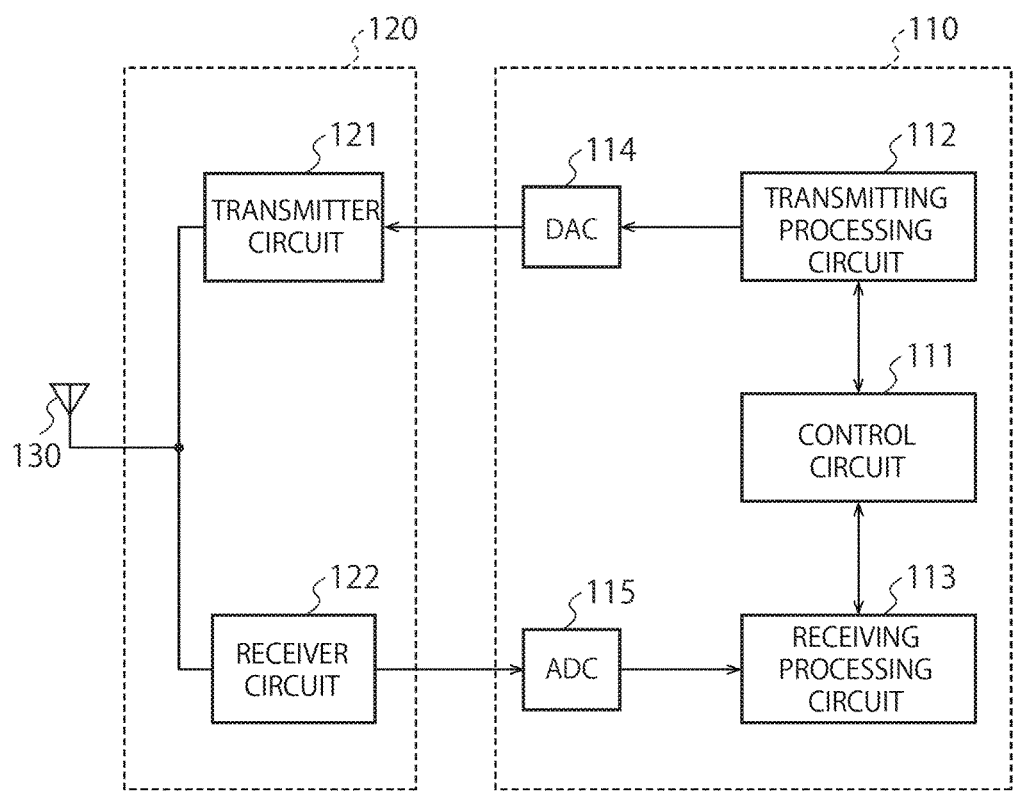
FIG. 17 is a diagram showing an example of a wireless communication device according to a fifth embodiment.

A wireless communication device according to a fifth embodiment will be explained referring to FIG. 17. The wireless communication device according to the present embodiment has the A/D converter circuit according to the first embodiment. FIG. 17 is a diagram showing an example of a wireless communication device according to the present embodiment. As shown in FIG. 17, the wireless communication device according to the present embodiment has a BB integrated circuit 110, an RF integrated circuit 120, and an antenna 130.

The BB integrated circuit 110 has a control circuit 111, a transmitting processing circuit 112, a receiving processing circuit 113, a D/A converter (DAC) 114, and an A/D converter (ADC) 115. The control circuit 111, transmitting processing circuit 112, and receiving processing circuit 113 in the BB integrated circuit 110 perform digital signal processing. The digital transmission signal generated by the transmitting processing circuit 112 is converted into an analog transmission signal by the D/A converter 114 and inputted into the RF integrated circuit 120. When the D/A converter 114 is omitted, the analog transmission signal can be generated by inputting the digital transmission signal directly into the RF integrated circuit 120 and modulating a PLL (phase-locked loop) circuit directly. The A/D converter 115 of FIG. 17 is the A/D converter circuit according to the first embodiment.

The control circuit 111 performs processing of e.g. MAC (Media Access Control) layer. The control circuit 111 may perform processing of a layer higher than the MAC layer in the network hierarchy. Further, the control circuit 111 may perform processing concerning MIMO (Multi-Input Multi-Output). For example, the control circuit 111 may perform processing for estimating a propagation channel, calculating transmission weight, separating a stream, etc.

The transmitting processing circuit 112 generates a digital transmission signal. The receiving processing circuit 113 performs demodulation and decoding, and then analyzes a synchronization word, a preamble, and a physical header.

The RF integrated circuit 120 has a transmitter circuit 121 and a receiver circuit 122. Although not shown in the drawing, the transmitter circuit 121 has a transmitting filter for extracting a signal in the transmission band, a mixer for up-converting the signal after passing the transmitting filter into a radio frequency, an amplifier for amplifying the up-converted signal.

In the example of FIG. 17, the wireless communication device has one antenna 130, but it may have a plurality of antennas 130.

When transmitting/receiving a radio signal by each antenna 130, the RF integrated circuit 120 may have a switch for connecting any one of the transmitter circuit 121 and receiver circuit 122 to the antenna. Such a switch makes it possible to connect the antenna to the transmitter circuit 121 at the time of transmission, and connect the antenna to the receiver circuit 122 at the time of reception.

The RF integrated circuit 120 and BB integrated circuit 110 shown in FIG. 17 may be formed on one chip, or may be formed on separate chips respectively. Further, it is also possible to use a discrete part to form a part of the RF integrated circuit 120 and BB integrated circuit 110 while using one or more chips to form the rest thereof.

Further, the RF integrated circuit 120 and BB integrated circuit 110 may be formed using a wireless device which can be reconfigured based on software. In this case, a digital signal processor should be used to realize the functions of the RF integrated circuit 120 and BB integrated circuit 110 by software. In this case, the wireless communication device shown in FIG. 17 includes a bus, a processor, and an external interface. The processor and external interface are connected to each other through the bus, and firmware is executed by the processor. The firmware can be updated by a computer program. Due to the firmware executed by the processor, the RF integrated circuit 120 and BB integrated circuit 110 shown in FIG. 17 can perform processing.

The wireless communication device shown in FIG. 17 can be applied to: a stationary wireless communication device such as an access point, a wireless router, and a computer; a portable wireless terminal such as a smartphone and a cellular phone; a peripheral device such as a mouse and a keyboard for wirelessly communicating with a host device; a card-type member (such as an IC card, a memory card, and a SIM card) having wireless communication functions; and a wearable terminal for wirelessly communicating biological information.

The system of wireless communication between the wireless communication devices as shown in FIG. 17 should not be particularly limited, and various types of communication systems such as post-third-generation cellular communication, wireless LAN, Bluetooth (registered trademark), and proximity wireless communication can be used.

Further, the A/D converter 115 of FIG. 17 may be the A/D converter circuit according to the second embodiment, may be the A/D converter circuit according to the third embodiment, or may be the A/D converter circuit according to the fourth embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An A/D converter circuit comprising:
   an amplifier circuit to amplify an input signal and output a first amplification signal and a second amplification signal, the second amplification signal having an amplification error smaller than that in the first amplification signal;
   a first sampling circuit to sample the first amplification signal;
   a first A/D converter to perform A/D conversion on the first amplification signal sampled by the first sampling circuit and output a first digital signal;
   a second sampling circuit to sample the second amplification signal;
   a D/A converter to perform D/A conversion on the first digital signal and output a first analog signal;
   a subtracter to subtract the first analog signal from the second amplification signal sampled by the second sampling circuit and output a second analog signal; and
   a second A/D converter to perform A/D conversion on the second analog signal and output a second digital signal.

2. The A/D converter circuit of claim 1, wherein the first sampling circuit samples the first amplification signal in an operation phase different from an operation phase for the second sampling circuit to sample the second amplification signal.

3. The A/D converter circuit of claim 1, wherein the amplifier circuit is a successive approximation amplifier comprising an operational amplifier.

4. The A/D converter circuit of claim 3,
   wherein the first amplification signal is an output signal obtained before the successive approximation amplifier performs successive approximation, and
   the second amplification signal is an output signal obtained after the successive approximation amplifier performs successive approximation.

5. The A/D converter circuit of claim 1, wherein the amplifier circuit is a CLS amplifier having an operational amplifier.

6. The A/D converter circuit of claim 5,
   wherein the first amplification signal is an output signal obtained before the CLS amplifier performs level-shifting, and
   the second amplification signal is an output signal obtained after the CLS amplifier performs level-shifting.

7. The A/D converter circuit of claim 1, wherein the amplifier circuit is an inverting amplifier comprising an operational amplifier.

8. The A/D converter circuit of claim 1,
   wherein the amplifier circuit comprises a first amplifier and a second amplifier,
   the first amplification signal is an output signal of the first amplifier, and
   the second amplification signal is an output signal of the second amplifier.

9. The A/D converter circuit of claim 1, wherein at least one of frequency of operation of the amplifier circuit and driving power of the amplifier circuit is controlled by the first digital signal.

10. The A/D converter circuit of claim 1, wherein the first A/D converter is used also as the second A/D converter.

11. The A/D converter circuit of claim 10 further comprising a switch to be capable of connecting an input terminal of the first A/D converter to an output terminal of the first sampling circuit and an output terminal of the subtracter.

12. The A/D converter circuit of claim 1, wherein the second A/D converter has redundancy.

13. A pipeline A/D converter comprising an A/D converter circuit,
   the A/D converter circuit comprises:
   an amplifier circuit to amplify an input signal and output a first amplification signal and a second amplification signal, the second amplification signal having an amplification error smaller than that in the first amplification signal;
   a first sampling circuit to sample the first amplification signal;
   a first A/D converter to perform A/D conversion on the first amplification signal sampled by the first sampling circuit and output a first digital signal;
   a second sampling circuit to sample the second amplification signal;
   a D/A converter to perform D/A conversion on the first digital signal and output a first analog signal;
   a subtracter to subtract the first analog signal from the second amplification signal sampled by the second sampling circuit and output a second analog signal; and
   a second A/D converter to perform A/D conversion on the second analog signal and output a second digital signal.

14. A wireless communication device comprising an A/D converter circuit,
   the A/D converter circuit comprising:
   an amplifier circuit to amplify an input signal and output a first amplification signal and a second amplification signal, the second amplification signal having an amplification error smaller than that in the first amplification signal;
   a first sampling circuit to sample the first amplification signal;
   a first A/D converter to perform A/D conversion on the first amplification signal sampled by the first sampling circuit and output a first digital signal;
   a second sampling circuit to sample the second amplification signal;

a D/A converter to perform D/A conversion on the first digital signal and output a first analog signal;

a subtracter to subtract the first analog signal from the second amplification signal sampled by the second sampling circuit and output a second analog signal; and a second A/D converter to perform A/D conversion on the second analog signal and output a second digital signal.

15. The wireless communication device of claim 14, wherein the first sampling circuit samples the first amplification signal in an operation phase different from an operation phase for the second sampling circuit to sample the second amplification signal.

16. The wireless communication device of claim 14, wherein the amplifier circuit is a successive approximation amplifier comprising an operational amplifier.

17. The wireless communication device of claim 16, wherein the first amplification signal is an output signal obtained before the successive approximation amplifier performs successive approximation, and the second amplification signal is an output signal obtained after the successive approximation amplifier performs successive approximation.

18. The wireless communication device of claim 14, wherein the amplifier circuit is a CLS amplifier comprising an operational amplifier.

19. The wireless communication device of claim 18, wherein the first amplification signal is an output signal obtained before the CLS amplifier performs level-shifting, and the second amplification signal is an output signal obtained after the CLS amplifier performs level-shifting.

20. The wireless communication device of claim 14, wherein the amplifier circuit is an inverting amplifier comprising an operational amplifier.

* * * * *